(12) United States Patent
Liu et al.

(10) Patent No.: US 7,507,636 B2
(45) Date of Patent: Mar. 24, 2009

(54) AMORPHOUS SI/AU EUTECTIC WAFER BONDING STRUCTURE

(75) Inventors: Cheng-yi Liu, Jhongli (TW); Po-Han Chan, Jhongli (TW); Ching-Liang Lin, Jhongli (TW)

(73) Assignee: National Central University, Jhongli (TW)

( * ) Notice: Subject to any disclaimer, the term of this patent is extended or adjusted under 35 U.S.C. 154(b) by 172 days.

(21) Appl. No.: 11/649,892

(22) Filed: Jan. 5, 2007

(65) Prior Publication Data
US 2008/0138965 A1  Jun. 12, 2008

(30) Foreign Application Priority Data
Dec. 7, 2006  (TW) ............... 95145637 A

(51) Int. Cl.
*H01L 21/00*  (2006.01)

(52) U.S. Cl. ............ 438/455; 438/459
(58) Field of Classification Search .......... 438/455–459
See application file for complete search history.

(56) References Cited

U.S. PATENT DOCUMENTS

| 5,668,033 A * | 9/1997 | Ohara et al. ............ 438/113 |
| 6,242,324 B1 * | 6/2001 | Kub et al. ............... 438/455 |
| 6,607,969 B1 * | 8/2003 | Kub et al. ............... 438/458 |
| 2006/0273810 A1 * | 12/2006 | Ganitzer et al. ......... 324/755 |

* cited by examiner

*Primary Examiner*—Richard A. Booth
(74) *Attorney, Agent, or Firm*—Troxell Law Office PLLC

(57) ABSTRACT

An amorphous Si (silicon)/Au (gold) eutectic wafer bonding structure is fabricated. An amorphous Si obtained through coating or growth contacts with Au for bonding. The bonding layer is a Si/Au eutectic layer. Si is prevented from being precipitated. The bonding structure has a fast reaction ratio and a uniformed reaction. Thus, an electrical device has an improved electricity and reliability.

9 Claims, 10 Drawing Sheets

AMORPHOUS SI/AU EUTECTIC WAFER BONDING STRUCTURE

FIELD OF THE INVENTION

The present invention relates to fabricating a bonding structure; more particularly, relates to obtaining an amorphous Si (silicon) through coating or growth to contact with Au (gold) for bonding to obtain an eutectic wafer bonding structure, where Si is prevented from being precipitated and the bonding structure has an interface having a fast reaction ratio and a uniformed reaction and thus an electrical device having an improved electricity and reliability is obtained.

DESCRIPTION OF THE RELATED ART

In an eutectic reaction for bonding, traditionally an epitaxy surface of a Si wafer has limited reaction areas; and a porous bonding interface may be obtained which affects much on quality of an electrical device.

In addition, the traditional Si/Au eutectic wafer bonding provides Si required in the eutectic reaction through a Si wafer directly. However, Si may be precipitated on supersaturation; and the precipitated Si may harm an electrical device. Hence, the prior art does not fulfill users' requests on actual use.

SUMMARY OF THE INVENTION

The main purpose of the present invention is to control Si from being precipitated to obtain a wafer bonding structure which has a fast reaction ratio and a uniformed reaction and thus to obtain an electrical device having improved electricity and reliability.

To achieve the above purpose, the present invention is a method for fabricating an amorphous Si/Au eutectic wafer bonding structure, comprising steps of: (a) obtaining a first Si substrate; (b) providing an amorphous Si film on the first Si substrate; (c) obtaining a second substrate having a barrier layer and an Au layer; (d) contacting the amorphous Si film and the Au layer for obtaining an eutectic wafer bonding structure, where steps (b) can be replaced with adhering a barrier layer and an amorphous Si film on the first Si substrate; the bonding structure is a structure of barrier layer/Au/barrier layer or barrier layer/eutectic metal/barrier layer; the barrier layer prevents the eutectic metal from diffusing out of an eutectic reaction area and prevents exterior objects from diffusing into the eutectic reaction area; and Si in the area of the eutectic reaction is controlled to be prevented from being precipitated after the eutectic reaction.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is the flow view showing the first preferred embodiment according to the present invention;

DESCRIPTIONS OF THE PREFERRED EMBODIMENTS

The following descriptions of the preferred embodiments are provided to understand the features and the structures of the present invention.

Figure 1:
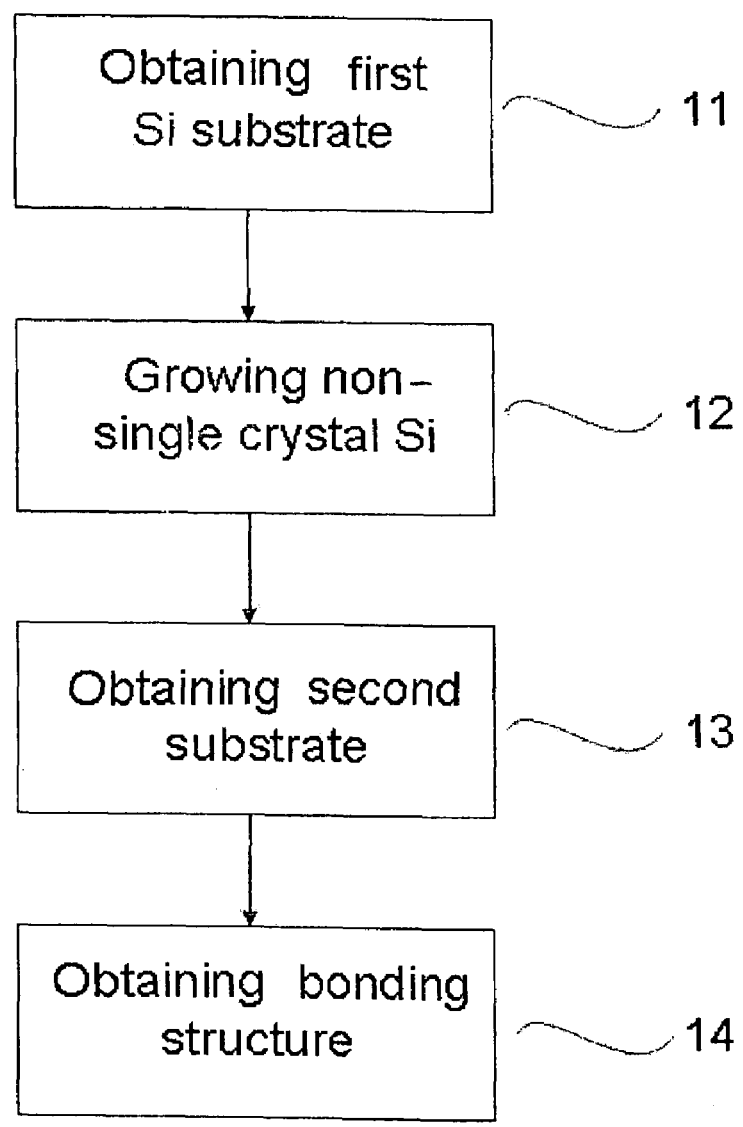
Figure 2:
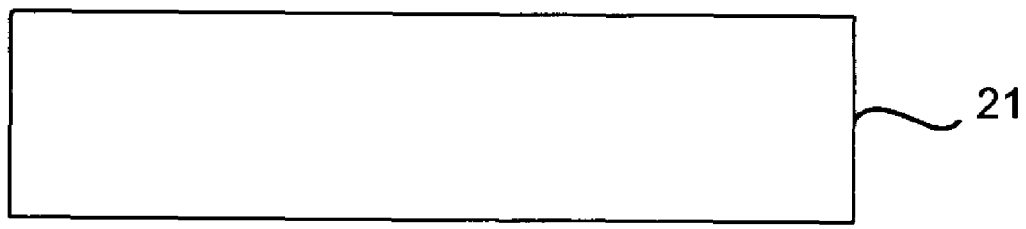
FIG. 2 to FIG. 5 are the structural views showing the first preferred embodiment.

Please refer to FIG. 1 to FIG. 5, which are a flow view and structural views showing a first preferred embodiment according to the present invention. As shown in the figures, the present invention is a method for fabricating an amorphous Si (silicon)/Au (gold) eutectic wafer bonding structure, comprising the following steps:

(a) Obtaining a first Si substrate 11: As shown in FIG. 2, a first Si substrate 21 is obtained.

Figure 3:
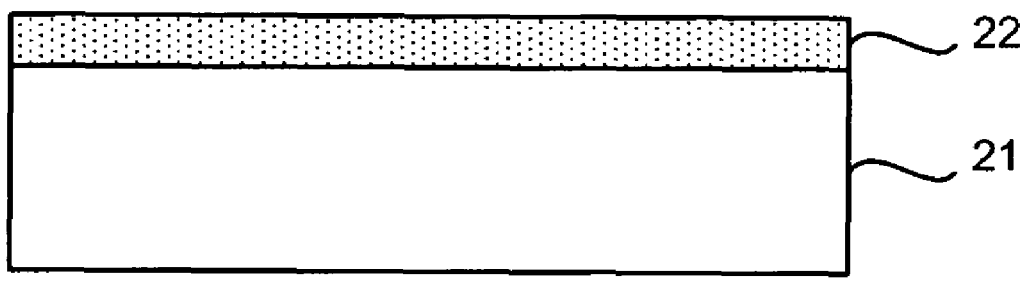

(b) Growing an amorphous Si film 12: As shown in FIG. 3, an amorphous Si film 22 is grown on a surface of the first Si substrate 21, where the amorphous Si film 22 is obtained through evaporation, film growth or heat treatment.

Figure 4:
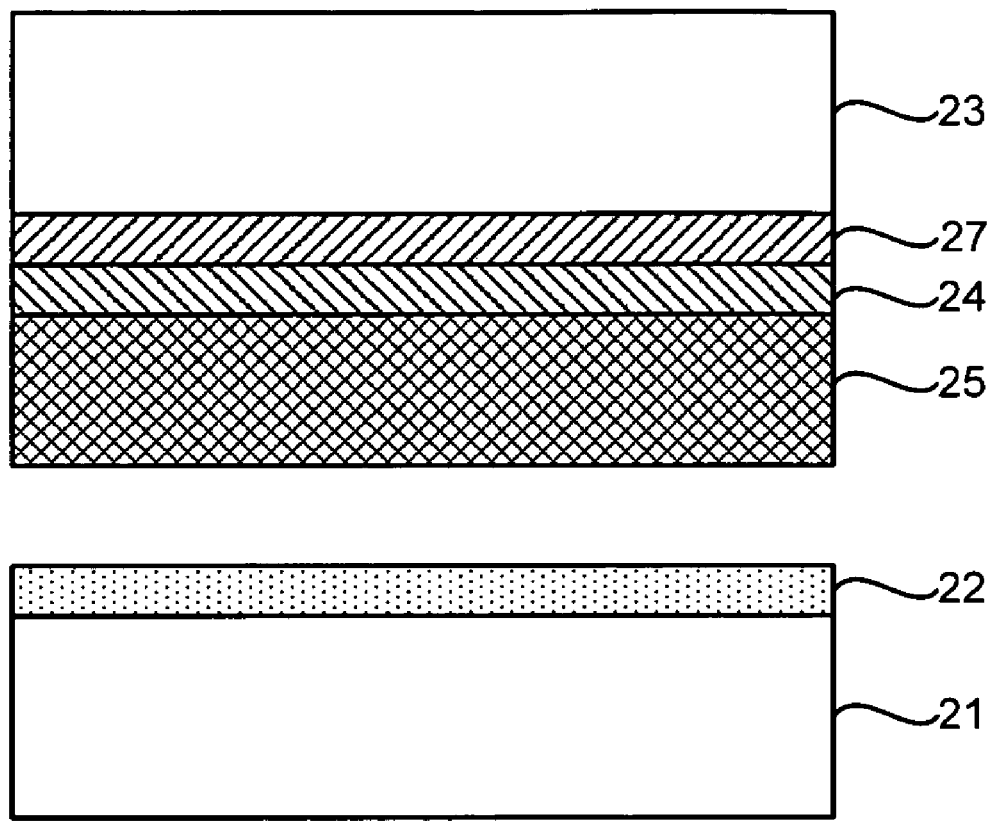

(c) Obtaining a second substrate 13: As shown in FIG. 4, a second Si substrate 23 having a barrier layer 24 and an Au layer 25 is obtained, where the barrier layer 24 and the Au layer 25 are adhered on the second Si substrate 23 with an adhesion layer 27.

Figure 5:
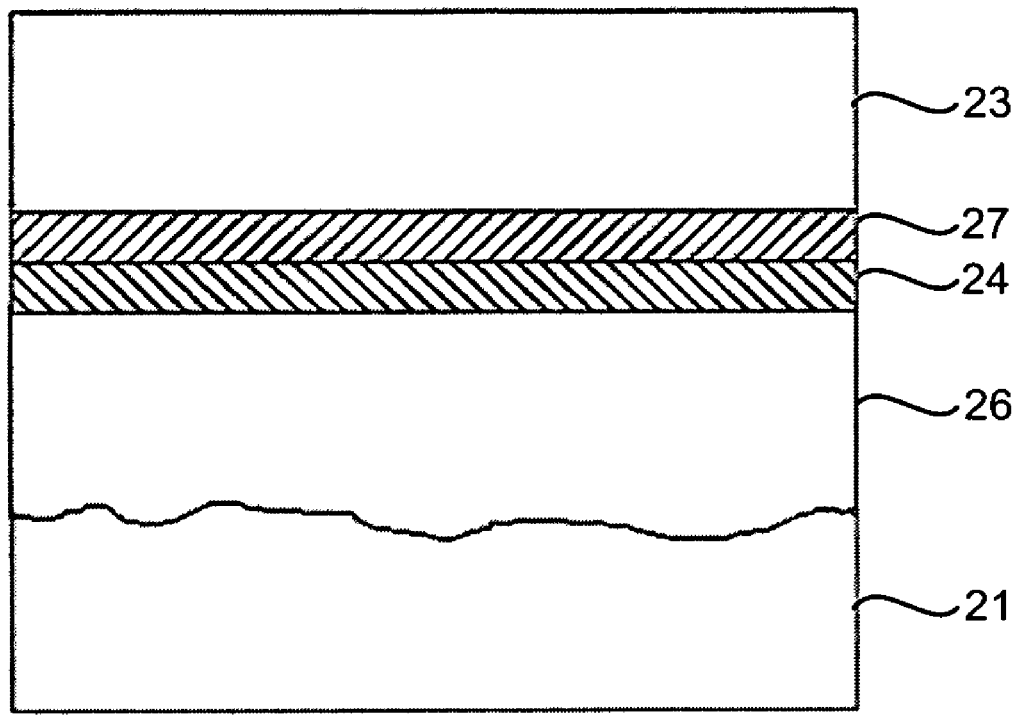
Figure 6:
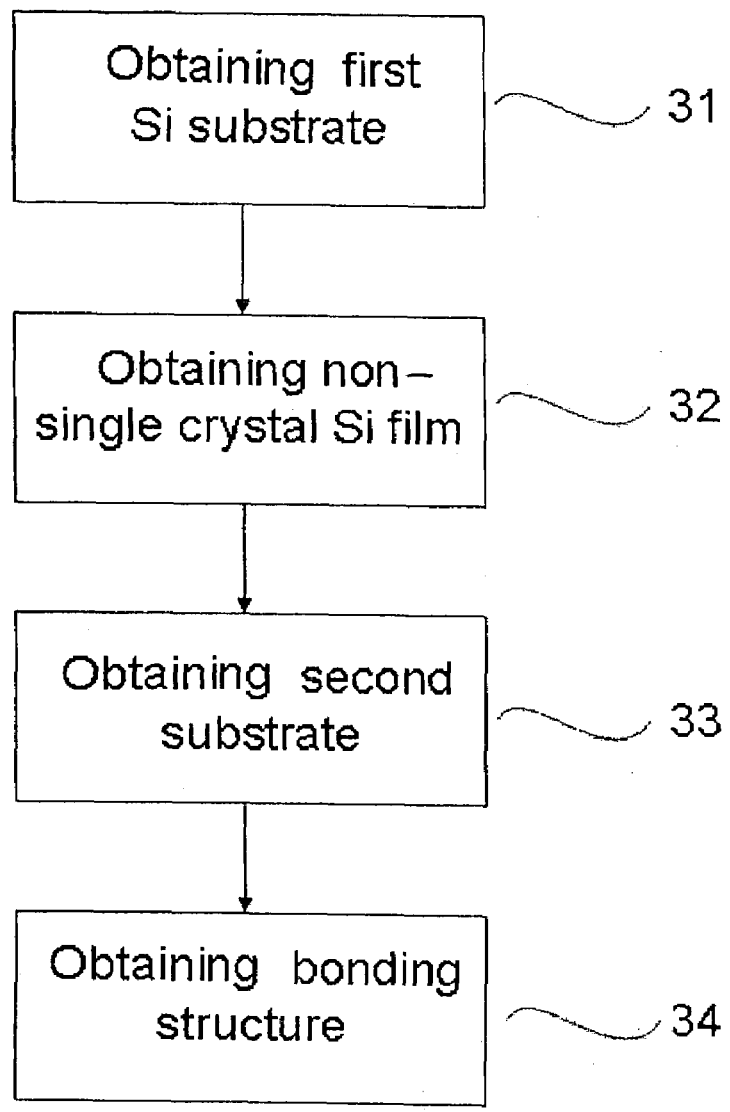
FIG. 6 is the flow view showing the second preferred embodiment.

(d) Obtaining a bonding structure 14: As shown in FIG. 5, the amorphous Si film 22 on the first Si substrate 21 is in contact with the Au layer 25 on the second substrate 23 to be processed with a heating and a pressing for obtaining an eutectic reaction area, so that a Si/Au eutectic alloy 26 is obtained through bonding. Thus, a bonding structure with an interface having a fast reaction ratio and a uniformed reaction is obtained.

Figure 7:
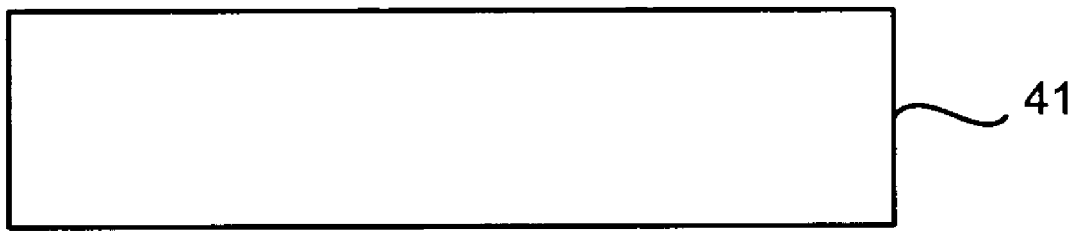
FIG. 7 to FIG. 10 are the structural views showing the second preferred embodiment.

Please refer to FIG. 6 to FIG. 10, which are a flow view and structural views showing a second preferred embodiment. As shown in the figures, the present invention is a method for fabricating an amorphous Si/Au eutectic wafer bonding structure, comprising the following steps:

(a) Obtaining a first Si substrate 31: As shown in FIG. 7, a first Si substrate 41 is obtained.

Figure 8:
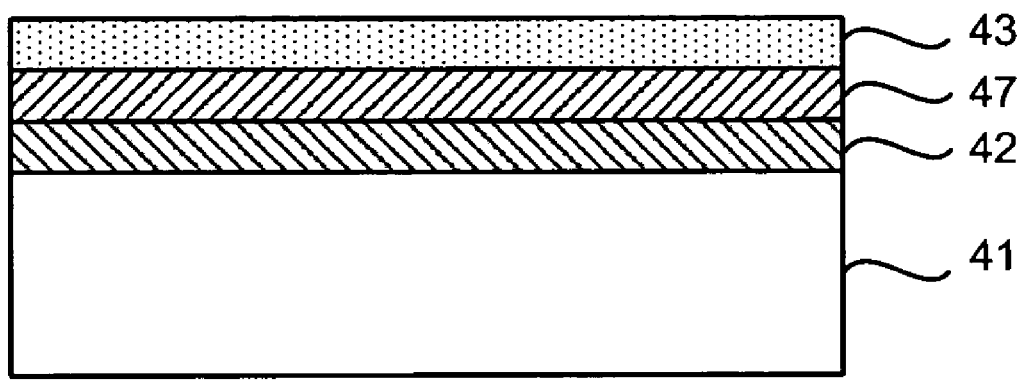

(b) Growing an amorphous Si film 32: As shown in FIG. 8, a barrier layer 42 and an amorphous Si film 43 are adhered to the first substrate 41 through an adhesion layer 47, where the amorphous Si film 43 has a thickness of one micrometer and is obtained through evaporation, film growth or heat treatment.

Figure 9:
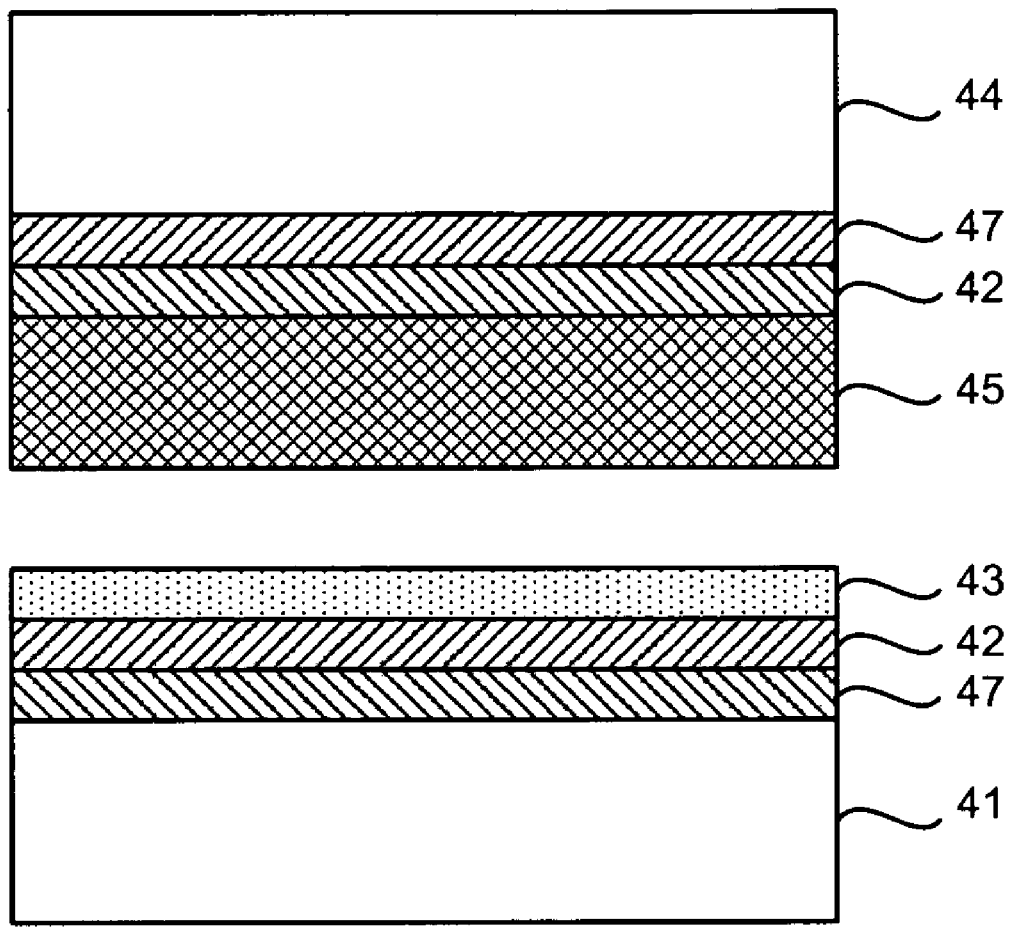

(c) Obtaining a second substrate 33: As shown in FIG. 9, a second Si substrate 44 having a barrier layer 42 and an Au layer 45 is obtained, where the barrier layer 42 and the Au layer 45 are adhered on the second Si substrate 44 with an adhesion layer 47.

Figure 10:
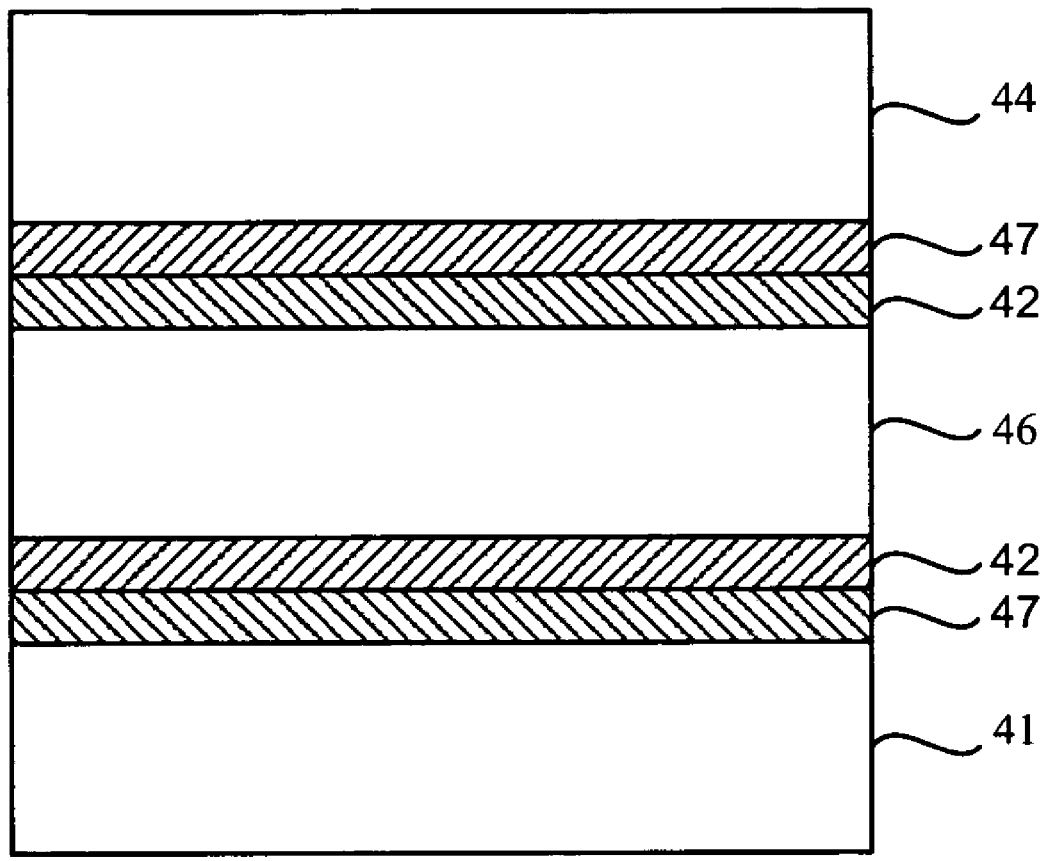

(d) Obtaining a bonding structure 34: As shown in FIG. 10, the amorphous Si film 43 on the first Si substrate 41 is in contact with the Au layer 45 on the second substrate 44 to be processed with a heating and a pressing for obtaining an eutectic reaction area, so that a Si/Au eutectic alloy 26 is obtained through bonding.

Therein, the barrier layer 42 prevents the Si/Au eutectic alloy 46 from diffusing out of the eutectic reaction area and prevents exterior objects from diffusing into the eutectic reaction area; and the barrier layer 42 controls Si provided in the eutectic reaction area to be prevented from being precipitated after the eutectic reaction. And the bonding structure is a structure of barrier-layer/Au/eutectic-alloy/Au/barrier-layer, or barrier-layer/eutectic-alloy/barrier-layer. Thus, a bonding structure with an interface having a fast reaction ratio and a uniformed reaction is obtained.

To sum up, the present invention is a method for fabricating an amorphous Si/Au eutectic wafer bonding structure, where an amorphous Si is obtained through coating or growth to be in contact with Au for bonding to obtain an eutectic wafer bonding structure; Si is prevented from being precipitated; and the bonding structure has an interface having a fast reaction ratio and a uniformed reaction and thus an electrical device having an improved electricity and reliability is obtained.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for fabricating an amorphous Si(silicon)/Au (gold) eutectic wafer bonding structure, comprising steps of:
   (a) obtaining a first Si substrate;
   (b) growing an amorphous Si film on said first Si substrate;
   (c) obtaining a second substrate having a barrier layer and an Au layer; and
   (d) contacting said amorphous Si film and said Au layer to obtain a bonding structure by processing an eutectic reaction to said amorphous Si film and said Au layer.

2. The method according to claim 1,
   wherein said amorphous Si film is obtained by using a method selected from a group consisting of evaporation, film growth and heat treatment.

3. The method according to claim 1,
   wherein said amorphous Si film has a thickness of 1 micrometer (μm).

4. A method for fabricating an amorphous Si/Au eutectic wafer bonding structure, comprising steps of:
   (a) obtaining a first Si substrate;
   (b) obtaining a barrier layer and an amorphous Si film on a surface of said first substrate;
   (c) obtaining a second substrate having a barrier layer and an Au layer; and
   (d) contacting said amorphous Si film and said Au layer to obtain a bonding structure by processing an eutectic reaction to said amorphous Si film and said Au layer.

5. The method according to claim 4,
   wherein said amorphous Si film is obtained by using a method selected from a group consisting of evaporation, film growth and heat treatment.

6. The method according to claim 4,
   wherein said amorphous Si film has a thickness of 1 μm.

7. The method according to claim 4,
   wherein said barrier layer prevents said Si/Au eutectic alloy from diffusing out of an area of said eutectic reaction; and
   wherein said barrier layer prevents exterior objects from diffusing into said area of said eutectic reaction.

8. The method according to claim 4,
   wherein said barrier layer prevents Si provided in an area of said eutectic reaction from being precipitated after said eutectic reaction.

9. The method according to claim 1,
   wherein said bonding structure is a structure selected from a group consisting of barrier-layer/Au/eutectic-alloy/Au/barrier-layer, and barrier-layer/eutectic-alloy/barrier-layer.

* * * * *